United States Patent
Gray (10) Patent No.: US 10,379,166 B2
(45) Date of Patent: Aug. 13, 2019

(54) CABINET AND BATTERY MANAGEMENT AND MONITORING SYSTEM FOR USE WITH UNINTERRUPTIBLE POWER SUPPLIES

(71) Applicant: LiiON, LLC, West Dundee, IL (US)

(72) Inventor: Gary Lee Gray, West Dundee, IL (US)

(73) Assignee: LiiON, LLC, West Dundee, IL (US)

( * ) Notice: Subject to any disclaimer, the term of this patent is extended or adjusted under 35 U.S.C. 154(b) by 484 days.

(21) Appl. No.: 14/872,917

(22) Filed: Oct. 1, 2015

(65) Prior Publication Data

US 2016/0099598 A1  Apr. 7, 2016

Related U.S. Application Data

(60) Provisional application No. 62/058,773, filed on Oct. 2, 2014.

(51) Int. Cl.
| | | |
|---|---|---|
| *H02J 7/00* | (2006.01) | |
| *H02J 9/06* | (2006.01) | |
| *G01R 31/36* | (2019.01) | |

(52) U.S. Cl.
CPC ........ *G01R 31/3648* (2013.01); *H02J 7/0029* (2013.01); *H02J 7/0031* (2013.01);
(Continued)

(58) Field of Classification Search
CPC ...... H02J 7/0052; H02J 7/0014; H02J 7/0021; H02J 7/0016; H02J 7/00; H02J 9/061;
(Continued)

(56) References Cited

U.S. PATENT DOCUMENTS

| | | | |
|---|---|---|---|
| 8,193,662 B1 | 6/2012 | Carlson et al. | |
| 9,496,730 B2 * | 11/2016 | Gallegos | B60L 3/0046 |

(Continued)

FOREIGN PATENT DOCUMENTS

EP    2908193 A2    8/2015

OTHER PUBLICATIONS

Neil Rasmussen; "The Different Types of UPS Systems"; article; 2011; pp. 1-10; White Paper 11, Revision 7; Schneider Electric; DCSC@Schneider-Electric.com.

(Continued)

*Primary Examiner* — Fritz M Fleming
*Assistant Examiner* — Jagdeep S Dhillon
(74) *Attorney, Agent, or Firm* — Miller, Matthias & Hull LLP (57) ABSTRACT

A battery management and monitoring system for monitoring a lithium battery module is provided. The battery management and monitoring system may include a memory configured to retrievably store one or more algorithms, and a controller in communication with the memory. Based on the one or more algorithms, the controller may be configured to at least monitor a data signal corresponding to one or more parameters indicative of an operating condition of the lithium battery module, and generate a control signal based on the data signal configured to selectively engage one or more contactors in communication with the lithium battery module to at least temporarily isolate the lithium battery module if one or more of the parameters exceed predefined thresholds.

20 Claims, 5 Drawing Sheets

(52) U.S. Cl.
CPC ......... *H02J 9/061* (2013.01); *H02J 2007/004* (2013.01); *H02J 2007/0037* (2013.01); *H02J 2007/0039* (2013.01); *H02J 2007/0067* (2013.01)

(58) Field of Classification Search
CPC . H02J 9/06; G01R 19/00; G01R 31/36; G06F 17/13; G01K 13/00
USPC ....... 307/66, 64, 82, 9.1; 320/121, 118, 119; 703/2; 702/34, 63
See application file for complete search history.

(56) References Cited

U.S. PATENT DOCUMENTS

| | | | |
|---|---|---|---|
| 9,577,443 B2* | 2/2017 | Gach | ..................... H02J 7/0021 |
| 2005/0162836 A1 | 7/2005 | Briggs et al. | |
| 2008/0158008 A1 | 7/2008 | Kagan et al. | |
| 2011/0248680 A1* | 10/2011 | Timmons | ............ H01M 2/1072 |
| | | | 320/120 |
| 2011/0291565 A1 | 12/2011 | Hysell et al. | |
| 2013/0090900 A1* | 4/2013 | Gering | ................. G01R 31/392 |
| | | | 703/2 |
| 2014/0145678 A1* | 5/2014 | Hwang | ..................... H02J 3/32 |
| | | | 320/118 |
| 2014/0184161 A1* | 7/2014 | Deal | ..................... H02J 7/0014 |
| | | | 320/121 |
| 2014/0285022 A1* | 9/2014 | Dao | ........................ H02J 9/061 |
| | | | 307/66 |
| 2015/0318582 A1* | 11/2015 | Brockman | ............ H02J 7/0052 |
| | | | 320/137 |
| 2015/0318725 A1* | 11/2015 | Brockman | ............ H02J 7/0047 |
| | | | 340/636.1 |
| 2016/0099598 A1 | 4/2016 | Gray | |
| 2016/0149271 A1* | 5/2016 | Horito | ................. H01M 10/425 |
| | | | 320/112 |
| 2016/0301222 A1* | 10/2016 | Samuel | ................. H02J 7/0014 |

OTHER PUBLICATIONS

Jeffrey Samstad; "Technical Comparison of On-Line vs. Line-Interactive UPS Designs"; article; 2011; pp. 1-12; White Paper 79, Revision 1; Schneider Electric; DCSC@Schneider-Electric.com.
European Search Report for related Application No. 16 173368 dated Feb. 10, 2017.

* cited by examiner

| Operational Condition | Thresholds/Settings | | | Action Taken |
|---|---|---|---|---|
| | Cell Voltage | Module Voltage | System Voltage | |
| Over Voltage Alarm | 3.9 | 31.2 | 624 | Open contactors |
| Over Voltage Warning | 3.8 | 30.4 | 608 | Generate notification |
| Float Voltage | 3.5 | 28.0 | 560 | Controlled by UPS |
| Nominal Voltage | 3.0 | 24.0 | 480 | Controlled by UPS |
| Cut Off Voltage | 2.5 | 20.0 | 400 | Controlled by UPS |
| Under Voltage Warning | 2.3 | 18.4 | 368 | Generate notification |
| Under Voltage Alarm | 2.1 | 16.8 | 336 | Open contactors |

FIG.5

| Operational Condition | Thresholds/Settings | Action Taken |
|---|---|---|
| Over Temperature Alarm | 60°C | Open contactors |
| Over Temperature Warning | 55°C | Generate notification |
| Over Temperature on PCBA, Alarm | 75°C | Open contactors |
| Over Temperature on PCBA, Warning | 80°C | Generate notification |
| Max Continuous Current (Amp), Warnging | Current exceeds 230A for 750 sec. | Generate notification |
| Max Continuous Current (Amp), Alarm | Current exceeds 240A for 600 sec. | Open contactors |
| Max Continuous Current (Amp), Shutdown | Current exceeds 450A for 70 sec. | Open contactors |
| Max Current for Module (Amp), Shutdown | Current exceeds 700A for 10 sec. | Open contactors |

FIG.6

CABINET AND BATTERY MANAGEMENT AND MONITORING SYSTEM FOR USE WITH UNINTERRUPTIBLE POWER SUPPLIES

CROSS-REFERENCE TO RELATED APPLICATION

This is a non-provisional US patent application claiming priority under 35 U.S.C. § 119(e) to U.S. Provisional Patent Application No. 62/058,773 filed on Oct. 2, 2014.

TECHNICAL FIELD

The present disclosure generally relates to uninterruptible power supply (UPS) systems, and more particularly, to systems and methods for energy storage capable of using lithium batteries and automatically managing and monitoring the battery modules associated with UPS systems.

BACKGROUND

Uninterruptible power supply (UPS) systems are commonly used in a variety of different applications and in varying scales for the common goal of providing emergency or back-up electrical power to computer systems in the event of a failure in the utility power. A typical UPS may include one or more lead acid batteries and associated circuitry that can be used to store electrical power when utility power is available, and supply electrical power to connected loads if the utility power ever becomes unavailable or unsuitable. In addition, the electrical power that is output by the lead acid batteries of the UPS during a power failure may be conditioned to be comparable to that of an appropriately conditioned utility power signal so as to support the connected loads for the duration of the outage or at least until the connected loads can be safely shut down. By maintaining power to connected critical power systems or by at least temporarily extending the runtimes thereof, UPS systems help to avoid abrupt shutdowns and minimize costly downtime.

With the continued reliance on UPS solutions today, it is becoming increasingly more important to monitor, manage, and maintain the health and condition of the lead acid batteries or lead acid battery modules associated with the UPS. Some conventional systems exist for providing automatic monitoring of UPS lead acid batteries. However, these systems are typically powered by the UPS system itself, provide limited lead acid battery runtime, and/or otherwise cannot function in the event of power failures, such as failures in the utility power and within the UPS. Also, conventional lead acid battery management systems are generally limited in terms of display or interface options, as well as in terms of the ability to customize settings or safety thresholds of the UPS lead acid batteries. Furthermore, conventional management systems lack self-contained and modular enclosure options for housing lead acid battery monitoring systems that are not only adaptable to different UPS systems and different lead acid battery types, but also in compliance with industry safety standards, such as those set forth by Underwriters Laboratories (UL), and the like.

Accordingly, in view of the foregoing deficiencies and disadvantages associated with conventional UPS configurations and lead acid batteries including hazardous materials such as lead and the monitoring systems therefor, a need exists for more adaptable interface architecture or integrated solution that can accommodate for future energy storage platforms, such as different types of lithium chemistry batteries, while reliably allowing for extended battery runtimes. A need also exists for more modular or self-contained battery management and monitoring solutions which provide better interface options and improved safety measures for UPS batteries and battery modules.

SUMMARY OF THE DISCLOSURE

In one aspect of the present disclosure, a method for operating a battery management and monitoring system associated with a battery module is provided. The method may include receiving a data signal from the battery module corresponding to one or more parameters indicative of an operating condition of the battery module; monitoring the data signal for parameters exceeding predefined thresholds; and generating a control signal configured to selectively engage one or more contactors in communication with the battery module to at least temporarily isolate the battery module if one or more of the predefined thresholds are exceeded.

In another aspect of the present disclosure, a battery management and monitoring system for a battery module is provided. The battery management and monitoring system may include a memory configured to retrievably store one or more algorithms, and a controller in communication with the memory. The controller, based on the one or more algorithms, may be configured to at least monitor a data signal corresponding to one or more parameters indicative of an operating condition of the battery module, and generate a control signal based on the data signal configured to selectively engage one or more contactors in communication with the battery module to at least temporarily isolate the battery module if one or more of the parameters exceed predefined thresholds.

In yet another aspect of the present disclosure, a cabinet for an uninterruptible power supply is provided. The cabinet may include a battery module; a control circuit having a voltage converter, one or more contactors, and a breaker, each of which is selectively coupled to the battery module and the uninterruptible power supply; and a battery management and monitoring system having at least a controller that is electrically coupled to the voltage converter and operatively coupled to the contactors. The controller may be configured to at least monitor a data signal corresponding to one or more parameters indicative of an operating condition of the battery module, and generate a control signal based on the data signal configured to selectively engage the contactors to at least temporarily isolate the battery module if one or more of the parameters exceed predefined thresholds.

DETAILED DESCRIPTION

Although the following sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term is expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

Figure 1:
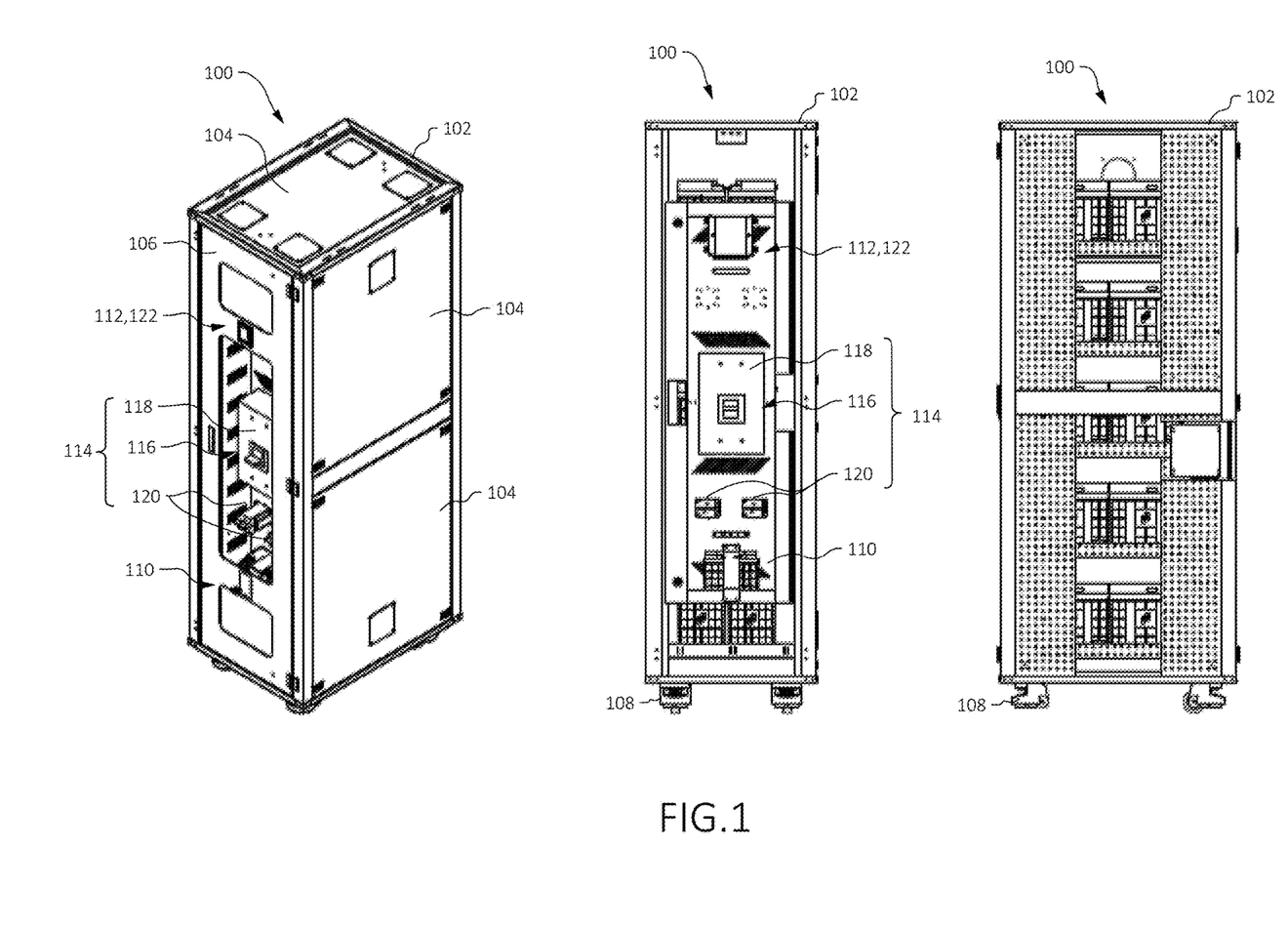
FIG. 1 is a set of perspective, front plan and side plan views of one exemplary cabinet for an uninterruptible power supply (UPS) constructed in accordance with the teachings of the present disclosure.

Referring now to FIG. 1, one exemplary embodiment of a cabinet 100 configured for use with an uninterruptible power supply (UPS) is illustrated. As shown, the cabinet 100 may generally be formed using a frame structure 102 that is configured to removably receive and essentially enclose one or more electrical devices or components associated with a UPS. The cabinet 100 may additionally include one or more panels 104 and/or doors 106, which may be hingably and/or removably coupled to the frame structure 102. Any one or more of the panels 104 and doors 106 may further be locked for added security, for instance, using mechanical, electrical, electromechanical, magnetic, electromagnetic, or any other suitable means for restricting physical access to the contents of the cabinet 100. Optionally, the cabinet 100 may also be provided with casters 108, or the like, to facilitate transport of the cabinet 100. In further options, the casters 108 may be provided with a locking or braking mechanism, a leveling mechanism, or any other mechanism configured to further facilitate installation of the cabinet 100 and improve overall adaptability.

As additionally shown in FIG. 1, the cabinet 100 may be configured to enclose, among other things, for example, one or more lithium battery modules 110, a battery management and monitoring system 112, and a control circuit 114 associated therewith. As will be discussed in more detail further below, the lithium battery modules 110 may include any one or more of a plurality of rechargeable lithium storage devices that are coupled together in series and/or in parallel, or otherwise configured to output the appropriate direct current (DC) voltage for connected loads. In alternative embodiments, the battery modules 110 may include batteries employing other chemistry variations, such as lead-acid batteries, lithium-ion batteries, lithium iron phosphate batteries, or the like. As also discussed in more detail below, the battery management and monitoring system 112 may generally serve to monitor the parameters of the lithium battery modules 110 for critical operating conditions, and to automatically isolate or otherwise protect the lithium battery modules 110 if a critical condition is detected. Correspondingly, the control circuit 114 may include, among other things, a power supply, such as a DC-to-DC voltage converter 116, a circuit breaker 118, contactors 120, and any other component or device that may be necessary for proper functionality of the battery management and monitoring system 112. Furthermore, the cabinet 100 may also include a screen or touchscreen display device 122, or at least a cut-out for such a display device 122, through which the battery management and monitoring system 112 may interface with local and/or remote users as discussed in more detail below.

Figure 2:
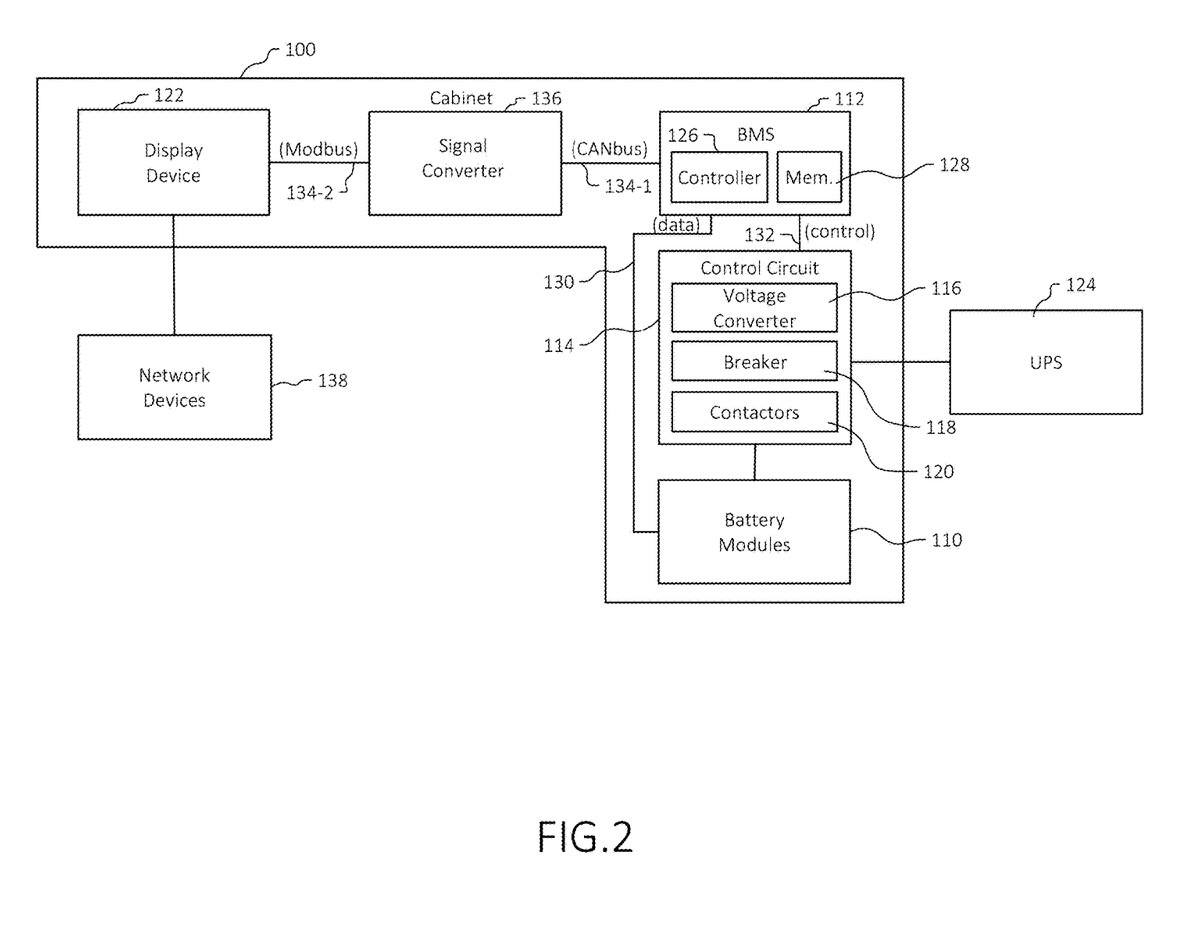
FIG. 2 is a schematic view of one exemplary cabinet configuration having a display device, a signal converter, a battery management and monitoring system, a control circuit and battery module.

Turning to FIG. 2, another embodiment of a cabinet 100 and the components thereof is schematically provided in more detail. As shown in FIG. 2, and similar to the embodiments of FIG. 1, the cabinet 100 may generally include at least the lithium battery modules 110, the battery management and monitoring system 112, and the control circuit 114. Moreover, the control circuit 114, as well as the voltage converter 116, circuit breaker 118 and contactors 120 thereof, may generally be disposed between the battery management and monitoring system 112 and each of the lithium battery modules 110 and the associated UPS 124 as shown. In particular, the voltage converter 116 may be a DC-to-DC voltage converter that is coupled in parallel with each of the lithium battery modules 110 and the UPS 124, and configured to supply power to the battery management and monitoring system 112 from either the lithium battery modules 110 or the UPS 124, depending on the given operating conditions. The breaker 118 may selectively couple the UPS 124 to each of the lithium battery modules 110 and the control circuit 114. Optionally, the breaker 118 may be implemented using traditional DC circuit breakers, or configured to incorporate auxiliary contacts, under-voltage release mechanisms, shunt trip mechanisms, or any combination thereof, based on the desired application.

The contactors 120 in FIG. 2 may include, for example, two high-voltage contactors, that are coupled in parallel between the lithium battery modules 110, the voltage converter 116 and the connected UPS 124. Furthermore, each of the contactors 120 may be operatively controlled by the battery management and monitoring system 112 to selectively close or open the circuit between the lithium battery modules 110 and each of the voltage converter 116 and the UPS 124 based on the detected operating conditions. More specifically, control of the contactors 120 may be managed by a controller 126 of the battery management and monitoring system 112 that is preprogrammed or configured to operate according to one or more algorithms that are retrievably stored within a memory 128. The memory 128 may be provided on-board the controller 126, external to the controller 126, or in otherwise communication therewith. The controller 126 may be implemented using any one or more of a processor, a microprocessor, a microcontroller, or any other suitable means for executing instructions stored within the memory 128. Additionally, the memory 128 may include non-transitory computer-readable medium or memory, such as a disc drive, flash drive, optical memory, read-only memory (ROM), or the like.

As shown in the embodiment of FIG. 2, the controller 126 of the battery management and monitoring system 112 may be configured to receive and monitor data signals 130 communicated from the lithium battery modules 110 for any critical conditions or conditions exceeding predefined safety thresholds. The data signals may include parameters pertaining to one or more of, for example, the temperature of the lithium battery modules 110, the temperature of the circuits of the lithium battery modules 110, the float voltage, the nominal voltage, the cut-off voltage, the output current, the state of the utility power, and the like. Correspondingly, the safety thresholds may be predefined to detect over-voltage conditions, under-voltage conditions, over-current conditions, over-temperature conditions of battery modules 110, over-temperature conditions of the circuits of the lithium battery module 110, and the like. If critical conditions are detected, the controller 126 may generate one or more control signals 132 configured to selectively engage the contactors 120, open the circuit leading to the lithium battery modules 110, and at least temporarily isolate the lithium battery modules 110, until conditions return to normal or until the battery management and monitoring system 112 is manually reset. Based on the breaker 118 or UPS 124 being used, abnormalities in the utility power may also trigger the breaker 118 to open and at least temporarily disconnect the cabinet 100 from the UPS 124.

Still further, the controller 126 of the battery management and monitoring system 112 in FIG. 2 may be configured to generate output signals 134 based on the data signals 130 to be communicated to the display device 122 or any other output device in communication with the battery management and monitoring system 112. Moreover, the output signals 134 may include information pertaining to the parameters being monitored by the battery management and monitoring system 112, such as parameters associated with the condition of the lithium battery modules 110 and/or the utility power. As shown, the controller 126 may optionally be configured to communicate output signals 134 through a signal converter 136 in arrangements where the display device 122 operates according to a different communications protocol than the one used by the battery management and monitoring system 112. For example, the controller 126 may be configured to communicate in a first format, such as in accordance with a controller area network (CAN) protocol, and the display device 122 may be configured to communicate in a second format, such as in accordance with a Modbus protocol. In such a case, the signal converter 136 may convert the first output signal 134-1 provided in CAN bus format, into a second output signal 134-2 provided in Modbus format.

Based on the output signals 134 that are received, the display device 122 of FIG. 2 may be configured to visually display using text, graphics, or the like, any relevant data or parameters pertaining to the lithium battery modules 110 and/or the incoming utility power. In other modifications, the display device 122 may also be configured to receive input from local users, such as via physical buttons, dials, capacitive touch pads, touch screen interfaces, or the like. Simple input received at the display device 122 may be used to change displays, menus, views, or other characteristics of the graphical user interface displayed. In other embodiments, the display device 122 may be configured to receive more advanced input or instructions, which may be transmitted to the controller 126 of the battery management and monitoring system 112 and used to override any preprogrammed routines or controls thereof. In still further modifications, the display device 122 may further provide network connectivity so as to enable access to and/or control of the battery management and monitoring system 112 by remote users. For instance, information communicated to the display device 122 may further be communicated to one or more network devices 138, such as routers, switches, modems, or any other suitable device capable of interchanging information between the display device 122, or the battery management and monitoring system 112, and one or more local area networks, wide area networks, other cabinets, and the like.

Figure 3:
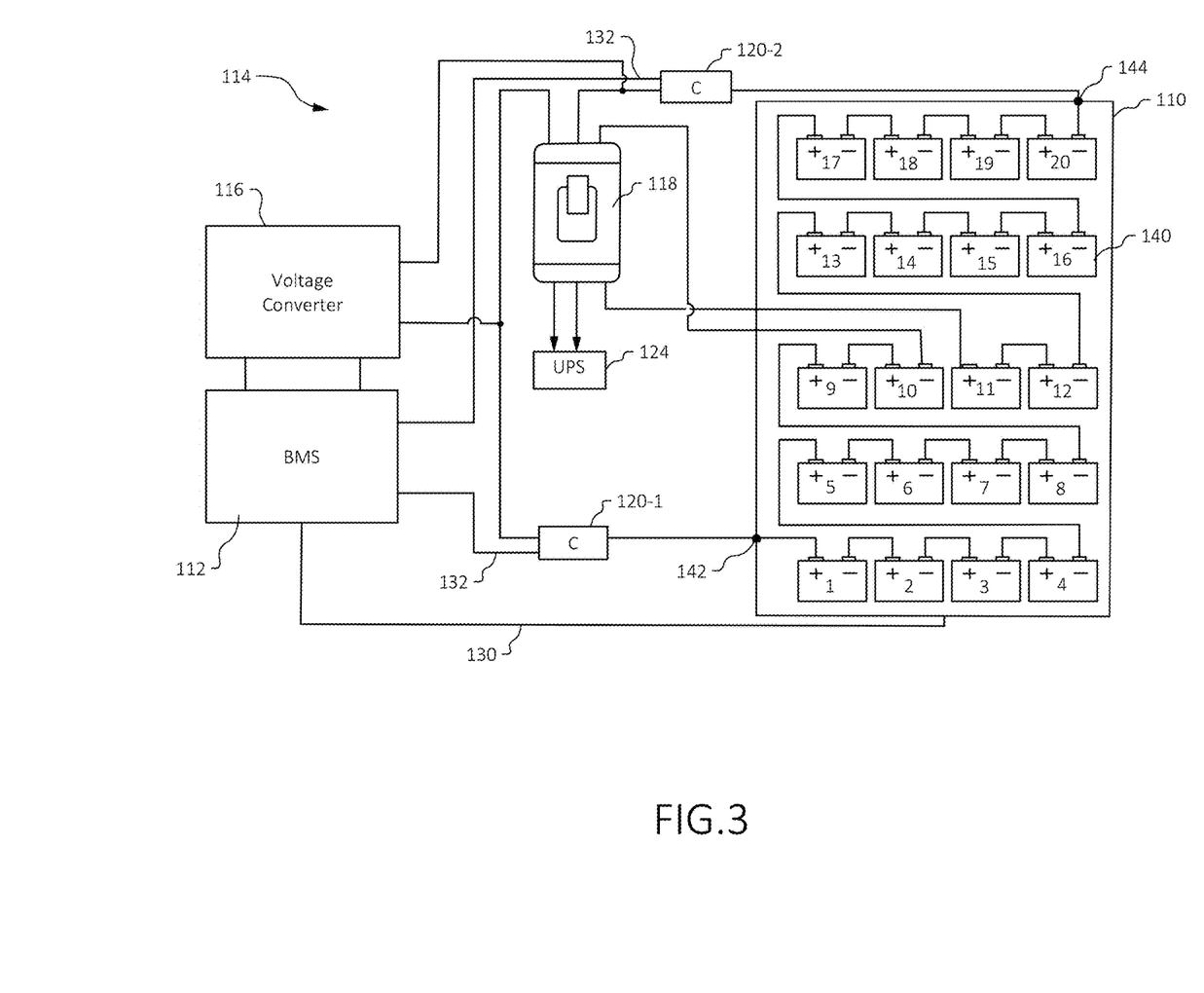
FIG. 3 is a schematic view of a battery management and monitoring system as coupled to a voltage converter, contactors, a breaker and a battery module.

Turning now to FIG. 3, one example implementation of the battery management and monitoring system 112 is provided in further detail. As shown in previous embodiments, the battery management and monitoring system 112 may be powered by the DC-to-DC voltage converter 116, which may in turn be powered by one of the lithium battery module 110 and the UPS 124. In particular, the voltage converter 116 may be coupled in parallel configuration with each of the lithium battery module 110 and the UPS 124 such that either source will supply power to the battery management and monitoring system 112. Moreover, the voltage converter 116 may be coupled to the lithium battery module 110 through parallel contactors 120, as well as coupled to the UPS 124 through the breaker 118. As previously discussed, the state of the breaker 118 may be subject to the state of the utility power and/or the associated UPS 124. The state of the contactors 120 may be subject to control by the battery management and monitoring system 112, which may further be subject to the state of the battery module 110 and/or the utility power. For example, the battery management and monitoring system 112 may selectively engage each of the contactors 120 via control signals 132 in response to any critical conditions in the lithium battery module 110 as determined via the data signals 130.

As also shown in FIG. 3, the lithium battery module 110 may be composed of a plurality of lithium batteries 140 coupled together in series and configured to output a DC voltage sufficient to support a connected UPS 124. More particularly, the effective positive terminal 142 of the lithium battery module 110 may be coupled to the first contactor 120-1, and the effective negative terminal 144 of the lithium battery module 110 may be coupled to the second contactor 120-2. As shown, one or more strings of the batteries 140 of the lithium battery module 110 may also be interconnected through the breaker 118. It will be understood that the number of batteries 140 provided per lithium battery module 110, the number of lithium battery modules 110 provided per cabinet 100 or battery management and monitoring system 112, and the manner in which the lithium batteries 140, the lithium battery modules 110 and the battery management and monitoring system 112 are interconnected, may vary depending on the application without departing from the scope of the appended claims. For example, multiple lithium battery modules 110 may be provided in a single cabinet 100 and connected in series or in parallel depending on the desired power output. Furthermore, fewer or more lithium batteries 140 may be provided per lithium battery module 110 than shown in FIG. 3. Correspondingly, the battery management and monitoring system 112 may be easily adaptable to accommodate any one of a number of different characteristics associated with different battery chemistries, such as lead-acid batteries, lithium-ion batteries, lithium iron phosphate batteries, or the like.

Figure 4:
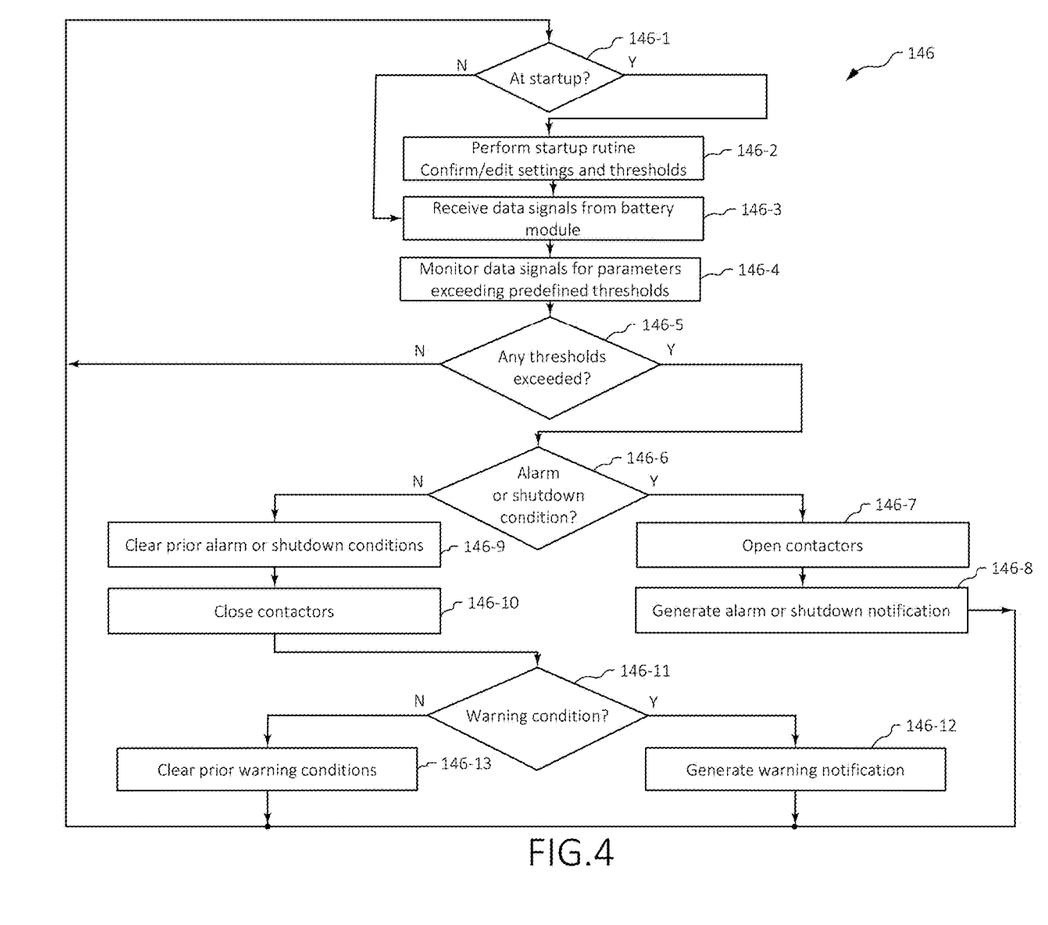
FIG. 4 is a flowchart depicting one exemplary algorithm or method that may be used to preprogram a controller of the battery management and monitoring system of the present disclosure to automatically monitor a battery module for a UPS.

In addition, while other variations and modifications will be apparent to those of ordinary skill in the art, one exemplary algorithm or method 146, by which the controller 126 may be configured to operate a battery management and monitoring system 112 and monitor an associated lithium battery module 110, is diagrammatically provided in FIG. 4. Moreover, the flow diagram of FIG. 4 may illustrate one example iteration of the method 146, which may automatically repeat at predetermined intervals and/or loop according to one or more conditionals. As shown in block 146-1, the method 146 may configure the controller 126 to initially determine if the battery management and monitoring system 112 is currently in a startup mode of operation, or for example, if the current iteration is the first iteration to be performed since the battery management and monitoring system 112 was powered on. If the battery management and monitoring system 112 is in a startup mode, the controller 126 according to block 146-2 may perform a preprogrammed startup routine. For example, the startup routine may automatically check for proper connectivity and functionality of all relevant components associated with the lithium battery module 110, the cabinet 100, the connected UPS 124 and/or the utility power, or the like. The startup routine may also confirm predefined thresholds and other settings relevant to the lithium battery module 110, the cabinet 100, the connected UPS 124 and/or the utility power, as shown for example by the values associated with lithium-ion batteries in FIGS. 5 and 6. Through the display device 122 and/or any connected network devices 138, the controller 126 may additionally enable the thresholds and settings to be edited and/or confirmed by manual user input.

Once the startup routine of block 146-2 of FIG. 4 is complete, or if the startup routine was bypassed as unnecessary, the controller 126 according to block 146-3 may be configured to receive data signals 130 from the lithium battery module 110 corresponding to one or more parameters indicative of the operating condition of the battery module 110. Specifically, the parameters may include data pertaining to one or more of the lithium battery temperature, the lithium battery circuit temperature, the float voltage, the nominal voltage, the cut-off voltage, the output current, and the like. Upon receiving the data signals 130, the controller 126 in accordance with block 146-4 may further monitor the parameters relative to corresponding predefined thresholds. As shown for example in FIGS. 5 and 6, the predefined thresholds may include thresholds corresponding to, for example, one or more of over-voltage conditions, under-voltage conditions, over-current conditions, over-temperature conditions in the batteries 140 of the lithium battery module 110, over-temperature conditions in any circuits associated with the lithium battery module 110, and the like. Accordingly, the controller 126 in block 146-5 may be configured to determine if one or more of the predefined thresholds are exceeded.

Figure 5:
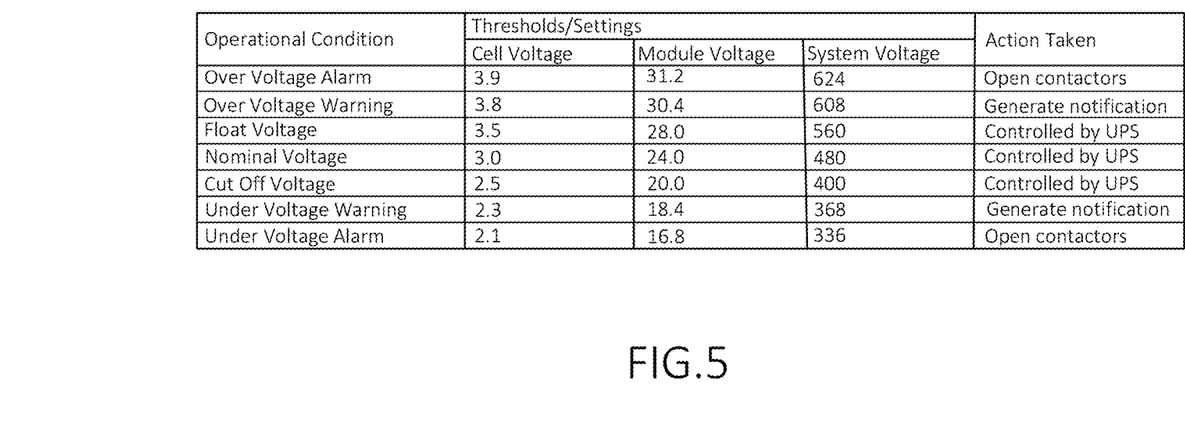
FIG. 5 is a table of exemplary settings, thresholds and corresponding operating conditions associated with lithium-ion battery cells that may be monitored by the battery management and monitoring system of the present disclosure.
Figure 6:
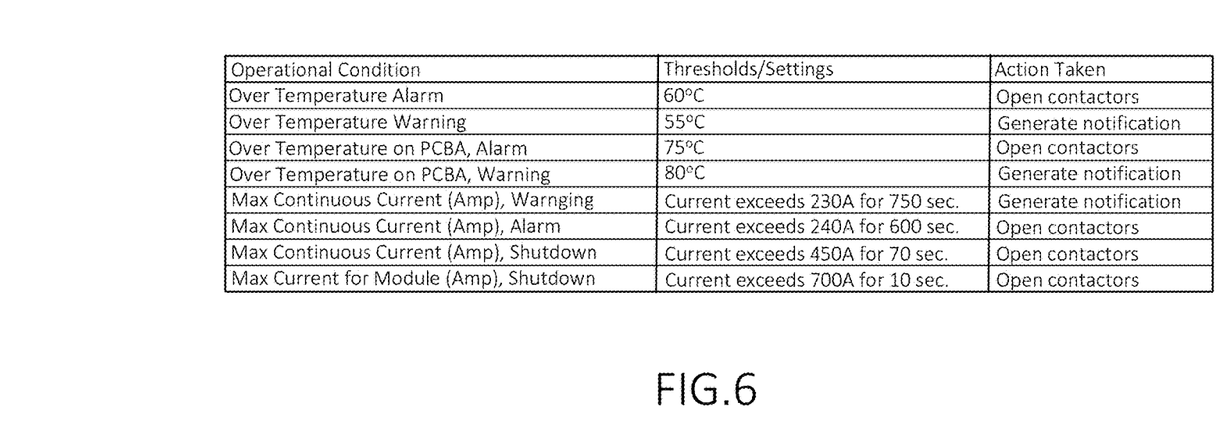
FIG. 6 is a table of additional exemplary settings, thresholds and corresponding operating conditions associated with lithium-ion battery cells that may be monitored by the battery management and monitoring system of the present disclosure.

If the controller 126 in block 146-5 of FIG. 4 determines that none of the predefined thresholds was exceeded for the given iteration, the controller 126 may return or loop back to block 146-1 and continue monitoring in a new iteration of the method 146. Alternatively, if the controller 126 in block 146-5 determines that one or more of the predefined thresholds were exceeded, the controller 126 may proceed to block 146-6 to determine if the exceeded thresholds suggest any alarm and/or shutdown conditions, or critical conditions that may be harmful to the lithium battery module 110, cabinet 100, and/or the UPS 124 if left unaddressed. For example, the controller 126 may be preprogrammed to assess a given set of parameters according to the predefined thresholds and corresponding actions as shown in FIGS. 5 and 6. If the exceeded threshold or group of exceeded thresholds corresponds to an alarm condition, the controller 126 in block 146-7 may generate control signals 132 configured to open the contactors 120 and at least temporarily isolate the battery module 110 to prevent any further damage. In accordance with the control circuits 114 of FIGS. 2 and 3, for example, opening the contactors 120 may electrically decouple the lithium battery module 110 from each of the battery management and monitoring system 112 and the UPS 124.

Optionally, as shown in block 146-8 of FIG. 4, the controller 126 may also generate alerts or notifications of the alarm condition, such as via the display device 122 and/or via network enabled devices 138. More specifically, the controller 126 may generate output signals 134 based on the data signals 130 and/or the control signals 132, in a format that is readable by the display device 122 and/or any connected network devices 138. If necessary, the controller 126 may alternatively generate output signals 134 in a first format, such as in accordance with a controller area network (CAN) protocol, to be converted by a signal converter 136, or the like, into a second format that is readable by the display device 122, such as in accordance with a Modbus protocol. Furthermore, it will be understood that other communication protocols or other types of signal converters may be employed to enable communication between the controller 126 and the peripheral devices associated with the cabinet 100. In other modifications, the controller 126 of the battery management and monitoring system 112 may be configured to communicate directly with peripheral devices in the appropriate format and without requiring signal converters 136. In still further modifications, any one or more of the display device 122 and network devices 138 may be at least partially incorporated within the battery management and monitoring system 112.

Once all of the appropriate actions have been taken in response to block 146-6 of FIG. 4, the controller 126 may then return to block 146-1 to continue monitoring for new warning, alarm and/or shutdown conditions, or to determine whether any pre-existing critical conditions should be cleared. If the exceeded thresholds do not amount to alarm or shutdown conditions in block 146-6, the controller 126 in block 146-9 may clear any previously triggered alarm or shutdown condition, and in block 146-10 close or electrically recouple any contactor 120 that may have been previously opened in response to a prior alarm or shutdown condition. Once prior alarm or shutdown conditions have been cleared, the controller 126 in block 146-11 may be configured to determine if the exceeded thresholds suggest any warning conditions, or less-critical conditions which may require monitoring but are not necessarily harmful to the lithium battery module 110, cabinet 100, and/or the UPS 124 if left unaddressed. The controller 126 may be preprogrammed to identify such a warning condition based on a given set of parameters and corresponding predefined thresholds, as shown for example in FIGS. 5 and 6. If the exceeded threshold or group of exceeded thresholds corresponds to a warning condition, the controller 126 in block 146-12 may generate a warning notification to local users, such as via the display device 122, and/or generate a warning notification to remote users, such as via network enabled devices 138, in a manner similar to blocks 146-7 and 146-8 for instance. Alternatively, if the controller 126 in block 146-11 determines that the exceeded thresholds do not amount to any alarm, shutdown or warning condition, the controller 126 in block 146-13 may clear any previously triggered warning condition and return to block 146-1 to continue monitoring for any new alarm, shutdown or warning condition.

In addition to protecting the lithium battery modules 110 during critical conditions, the hardware and software arrangements of the present disclosure further reduce downtime and minimize the need for manual user intervention by enabling the battery management and monitoring system 112 to automatically reset or automatically perform other responsive actions even during suboptimal scenarios. In a first scenario, for example, the utility power may fail and the lithium batteries 140 may discharge beyond the cut-off voltage limit, thereby triggering the breaker 118 to the UPS 124 to open. Although the utility power or power from the UPS 124 may be unavailable, the contactors 120 may remain closed and the lithium batteries 140 may remain coupled to the voltage converter 116 and the battery management and monitoring system 112. Specifically, while the battery output voltage may be insufficient to support loads connected to the UPS 124, the lithium batteries 140 may still, at least temporarily, maintain a charge sufficient to support the voltage converter 116 and the battery management and monitoring system 112. In such a way, the battery management and monitoring system 112 may be able to continue monitoring the condition of the lithium battery module 110, at least until utility power or power to the UPS 124 is restored or until the batteries 140 are completely discharged.

In a second scenario, the utility power may fail and the lithium batteries 140 may discharge at an abnormally fast rate or in excess of predefined thresholds, as shown for example by the thresholds for lithium-ion batteries listed in FIG. 6. In response, the contactors 120 may automatically open to prevent further discharge from the lithium batteries 140, which may also cut power to the voltage converter 116 and thus cause the battery management and monitoring system 112 to shut down. However, as the voltage converter 116 and the battery management and monitoring system 112 is also coupled in parallel to the UPS 124, the battery management and monitoring system 112 may be automatically reset once utility power is restored. Furthermore, upon reset, the battery management and monitoring system 112 may automatically perform a startup routine to ensure proper connectivity and functionality and to confirm all parameters are within acceptable limits or thresholds. If the lithium batteries 140 appear to be clear of all critical conditions, the battery management and monitoring system 112 may automatically close the contactors 120 to resume normal operations. However, if a pre-existing or a new critical condition is detected, the battery management and monitoring system 112 may maintain the contactors 120 in the opened state and continue monitoring for any significant change in the power conditions.

In a third scenario, the utility power may fail and the lithium batteries 140 may discharge as expected, but in doing so, exhibit other abnormalities or exceed safety thresholds, as shown for example by the thresholds for lithium-ion batteries listed in FIG. 6. For instance, the lithium batteries 140 may discharge beyond the cut-off voltage or beyond current limits, and/or the lithium batteries 140 or the circuitry associated therewith may overheat. Similar to the second scenario, the battery management and monitoring system 112 may automatically respond by opening the contactors 120 to prevent further discharge from the lithium batteries 140, which may also cut power to the voltage converter 116 and thus cause the battery management and monitoring system 112 to shut down. Once utility power and thus power to the voltage converter 116 is restored, the battery management and monitoring system 112 may automatically turn on and perform a startup routine to ensure proper functionality and to confirm all parameters are within acceptable limits or thresholds. If the lithium batteries 140 appear to be clear of all critical conditions, the battery management and monitoring system 112 may automatically close the contactors 120 to resume normal operations. However, if a pre-existing or a new critical condition appears is detected, the battery management and monitoring system 112 may maintain the contactors 120 in the opened state and continue monitoring for any significant change in the power conditions.

In a fourth scenario, the lithium battery module 110 may be in a float charge condition, or charged at a reduced rate by the UPS 124 and utility power, when a critical condition is detected from within the lithium battery module 110. Critical conditions may include alarm or shutdown conditions, such as those predefined for lithium-ion batteries in FIG. 6 for example. If the utility power feeding the voltage converter 116 is sufficiently stable, the battery management and monitoring system 112 may remain on and automatically respond by opening the contactors 120 to prevent further charging of the lithium batteries 140. Furthermore, so long as the utility power remains stable, the battery management and monitoring system 112 may continue monitoring parameters or conditions within the battery module 110. If parameters return to normal, the contactors 120 may be closed so as to reconnect the lithium battery module 110 to the UPS 124. If parameters do not return to normal after a predefined duration of time, the battery management and monitoring system 112 may require manual intervention or reset, or optionally generate notifications, or the like, requesting a manual reset or related repairs.

Furthermore, in a fifth scenario, for example, a failure may occur within the voltage converter 116 and/or the battery management and monitoring system 112, in which case the contactors 120 may be configured to automatically open as a precautionary measure. Optionally, an automated alert or error notification may be dispatched upon failure of the voltage converter 116 and the battery management and monitoring system 112 so as to notify relevant personnel and request a manual reset or repairs. Accordingly, the battery management and monitoring system 112 may require manual reset or intervention only in conditions where a failure exists in the voltage converter 116 or in the battery management and monitoring system 112, or in conditions where failures persist in both of the utility power and the lithium batteries 140 for a prolonged period of time. In most other scenarios and even in suboptimal conditions as noted above, the disclosed battery management and monitoring systems 112, as well as the control circuits 114 and algorithms or methods 146 associated therewith, are capable of automatically monitoring, protecting and otherwise responding to subcritical and/or critical conditions without manual intervention.

The foregoing embodiments may be configured to collectively provide several advantages over conventional UPS configurations and lead acid battery management and monitoring systems, while also maintaining full compliance with Underwriters Laboratory (UL) certifications and other industry standards. Moreover, the present disclosure may provide for more adaptable solutions that can accommodate for different types of lithium batteries while reliably allowing for extended lithium battery runtimes and increased power output. In one possible arrangement, a cabinet employing lithium iron phosphate battery modules may be capable of providing, for example, approximately 250 kW of output power over a span of approximately 90 seconds, or 25 kW of output power over a span of approximately 45 minutes. The present disclosure may also provide for more modular or self-contained battery management and monitoring solutions with better interface options and improved safety measures for UPS lithium batteries and lithium battery modules. Furthermore, cabinets and battery management and monitoring systems constructed in accordance with the foregoing disclosure may enable compliance with industry safety standards, such as UL standards UL 1973, UL 1778, UL 911, UL 1998, and the like.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A method for operating a battery monitoring system associated with a battery module, comprising:
   receiving a data signal from the battery module corresponding to one or more parameters indicative of an operating condition of the battery module;
   monitoring the data signal for parameters exceeding predefined thresholds; and
   generating based on the data signal a control signal configured to selectively engage one or more contactors in communication with the battery module to at least temporarily isolate the battery module from the battery monitoring system if one or more of the predefined thresholds are exceeded, and to open a breaker, which is connected to the one or more contactors and connected directly to the battery module, to disconnect the battery module from an uninterruptible power supply.

2. The method of claim 1, further comprising:
   generating a first output signal in a first format based on the data signal; and
   converting the first output signal into a second output signal having a second format readable by a display device.

3. The method of claim 2, wherein the first format of the first output signal is provided in accordance with a controller area network (CAN) protocol, and the second format of the second output signal is provided in accordance with a Modbus protocol.

4. The method of claim 1, wherein the parameters include data pertaining to one or more of temperature associated with one or more batteries of the battery module, temperature associated with one or more circuits of the battery module, float voltage, nominal voltage, cut-off voltage, and output current, and wherein the predefined thresholds pertain to one or more of over-voltage conditions, under-voltage conditions, over-current conditions, over-temperature conditions associated with one or more batteries of the battery module, and over-temprature conditions associated with one or more circuits of the battery module.

5. The method of claim 1, further comprising:
   identifying one of a warning condition and an alarm condition if one or more of the predefined thresholds are exceeded;
   generating a warning notification if a warning condition is identified;
   generating an alarm notification and opening the contactors to electrically decouple the battery module from each of the battery monitoring system and the associated uninterruptible power supply if an alarm condition is identified; and
   closing the contactors to electrically recouple the battery module to each of the battery monitoring system and the uninterruptible power supply if the alarm condition has been cleared.

6. A battery monitoring system for monitoring a battery module, comprising:
   a memory configured to retrievably store one or more algorithms; and
   a controller in communication with the memory and, based on the one or more algorithms, configured to at least:
   monitor a data signal corresponding to one or more parameters indicative of an operating condition of the battery module, and
   generate a control signal based on the data signal configured to selectively engage one or more contactors in communication with the battery module to at least temporarily isolate the battery module from the battery monitoring system if one or more of the parameters exceed predefined thresholds, and to open a breaker, which is connected to the one or more contactors and connected directly to the battery module, to disconnect the battery module from an uninterruptible power supply.

7. The battery monitoring system of claim 6, wherein the controller is configured to generate a first output signal in a first format based on the data signal to be converted into a second output signal in a second format by a signal converter that is readable by a display device.

8. The battery monitoring system of claim 7, wherein the first format is provided in accordance with a controller area network (CAN) protocol, and the second format is provided in accordance with a Modbus protocol.

9. The battery monitoring system of claim 6, wherein the parameters include data pertaining to one or more of temperature associated with one or more batteries of the battery module, temperature associated with one or more circuits of the battery module, float voltage, nominal voltage, cut-off voltage, and output current, and wherein the predefined thresholds pertain to one or more of over-voltage conditions, under-voltage conditions, over-current conditions, over-temperature conditions associated with one or more batteries of the battery module, and over-temperature conditions associated with one or more circuits of the battery module.

10. The battery monitoring system of claim 6, Therein the controller is further configured to:
    identify one of a warning condition and an condition if one or more of the predefined thresholds are exceeded,
    generate a warning notification if a warning condition is identified,
    generate an alarm notification and open the contactors to electrically decouple the battery module from each of the battery monitoring system and the associated uninterruptible power supply if an alarm condition is identified, and
    close the contactors to electrically recouple the battery module to each of the battery monitoring system and the uninterruptible power supply if the alarm condition has been cleared.

11. A cabinet for an uninterruptible power supply, comprising:
    a battery module;

a control circuit having a voltage converter, one or more contactors and a breaker each of which is selectively coupled to the battery module and the uninterruptible power supply; and a battery monitoring system having at least a controller that is electrically coupled to the voltage converter and operatively coupled to the contactors, the controller being configured to at least:

monitor a data signal corresponding to one or more parameters indicative of an operating condition of the battery module, and generate a control signal based on the data signal configured to selectively engage the contactors to at least temporarily isolate the battery module if one or more of the parameters exceed predefined thresholds, and to open a breaker, which is connected to the one or more contactors and connected directly to the battery module, to disconnect the battery module from an uninterruptible power supply.

12. The cabinet of claim 11, further comprising a display device configured to display information pertaining to at least the battery module and a signal converter configured to convert a first output signal provided by the controller in a first format into a second output signal having a second format that is readable by the display device.

13. The cabinet of claim 12, wherein the first format of the first output signal is provided in accordance with a controller area network (CAN) protocol, and the second format of the second output signal is provided in accordance with a Modbus protocol.

14. The cabinet of claim 12, wherein at least one of the display device, the signal converter, and the battery monitoring system is configured to communicate with a network device.

15. The cabinet of claim 11, wherein the voltage converter is a DC-to-DC voltage converter that is electrically disposed in parallel relative to each of the battery module and the uninterruptible power supply and configured to provide power to the battery monitoring system by at least one of the battery module, and the uninterruptible power supply, the voltage converter being selectively coupled to the battery module via the contactors, the voltage converter being selectively coupled to the uninterruptible power supply via the breaker.

16. The cabinet of claim 11, wherein a first one of the contactors is coupled to a positive terminal of the battery module and a second one of the contactors is coupled to a negative terminal of the battery module, each of the contactors being configured to selectively decouple the battery module from each of the voltage converter, the battery monitoring system, and the uninterruptible power supply based on the control signal.

17. The cabinet of claim 11, wherein the breaker includes an under-voltage release mechanism configured to automatically decouple the uninterruptible power supply from each of the battery module, the voltage converter, and the battery monitoring system in under-voltage conditions.

18. The cabinet of claim 11, wherein the parameters include data pertaining to one or more of temperature associated with one or more batteries of the battery module, temperature associated with one or more circuits of the battery module, float voltage, nominal voltage, cut-off voltage, and output current, and wherein the predefined thresholds pertain to one or more of over-voltage conditions, under-voltage conditions, over-current conditions, over-temperature conditions associated with one or more batteries of the battery module, and over-temperature conditions associated with one or more circuits of the battery module.

19. The cabinet of claim 11, wherein the controller is further configured to:

identify one of a warning condition and an alar condition if one or more of the predefined thresholds are exceeded, generate a warning notification if a warning condition is identified, generate an alarm notification and open the contactors to electrically decouple the battery module from each of the battery monitoring system and the associated uninterruptible power supply if an alarm condition is identified, and close the contactors to electrically recouple the battery module to each of the battery monitoring system and the uninterruptible power supply if the alarm condition has been cleared.

20. The cabinet of claim 11, wherein the battery module includes a plurality of lithium ion batteries.

* * * * *